(12) United States Patent
Sohn et al.

(10) Patent No.: US 7,045,469 B2
(45) Date of Patent: May 16, 2006

(54) METHOD OF FORMING A BUFFER DIELECTRIC LAYER IN A SEMICONDUCTOR DEVICE AND A METHOD OF MANUFACTURING A THIN FILM TRANSISTOR USING THE SAME

(75) Inventors: Choong Yong Sohn, Cheongju-Si (KR); Yong Hae Kim, Seongnam-Shi (KR); Jin Ho Lee, Daejon-Shi (KR); Young Wook Ko, Daejon-Shi (KR); Choong Heui Chung, Daejon-Shi (KR)

(73) Assignee: Electronics and Telecommunications Research Institute, (KR)

( * ) Notice: Subject to any disclaimer, the term of this patent is extended or adjusted under 35 U.S.C. 154(b) by 35 days.

(21) Appl. No.: 10/679,021

(22) Filed: Oct. 2, 2003

(65) Prior Publication Data

US 2004/0121529 A1 Jun. 24, 2004

(30) Foreign Application Priority Data

Dec. 18, 2002 (KR) ...................... 10-2002-0081480

(51) Int. Cl.
*H01L 21/31* (2006.01)
*H01L 21/469* (2006.01)

(52) U.S. Cl. ...................... 438/758; 438/781; 438/778
(58) Field of Classification Search ................ 438/758, 438/781, 691, 623, 778
See application file for complete search history.

(56) References Cited

U.S. PATENT DOCUMENTS

| 5,733,641 | A | 3/1998 | Fork et al. | |
| 6,372,666 | B1 * | 4/2002 | Ramos et al. | ................ 438/781 |
| 6,423,770 | B1 * | 7/2002 | Katz | ........................... 524/492 |
| 6,559,071 | B1 * | 5/2003 | Ramos et al. | ................ 438/781 |

(Continued)

FOREIGN PATENT DOCUMENTS

JP 2001-235765 8/2001

(Continued)

OTHER PUBLICATIONS

SID 02 Digest, "High-Mobility Poly-Si TFTs Employing XeCl Eximer Laser Annealing on Selectively Floating a-Si thin Film", C. Kim et al., pp. 905-907.

(Continued)

*Primary Examiner*—Walter L. Lindsay, Jr.
(74) *Attorney, Agent, or Firm*—Blakely Sokoloff Taylor & Zafman

(57) ABSTRACT

A method of forming a buffer dielectric film in a semiconductor device and a method of manufacturing a thin film transistor using the same are disclosed. By forming a buffer dielectric film containing porous silica material having low heat conductivity between the amorphous silicon layer and the substrate to minimize the heat transfer to the substrate and forming the polysilicon active layer using the laser in the state of securing the crystal growth time, polysilicon active layer having a maximized crystal particle size can be formed to improve the charge mobility of the device, in case of crystallizing the amorphous silicon layer by the ELA method, and the length of the SLG (Super Lateral Grain) can be increased to prevent the nucleation phenomenon from being generated at the portion that the crystals meet and thus the moved number of the mask can be minimized and the throughput of the process can be improved, though the interval of the mask pattern is increased, in case of crystallizing the amorphous silicon by the SLS method.

7 Claims, 5 Drawing Sheets

U.S. PATENT DOCUMENTS

| | | | |
|---|---|---|---|
| 6,639,246 B1 * | 10/2003 | Honda | 257/72 |
| 6,673,725 B1 * | 1/2004 | Shioya et al. | 438/778 |
| 6,740,938 B1 * | 5/2004 | Tsunoda et al. | 257/365 |
| 6,743,723 B1 * | 6/2004 | Fukumoto | 438/691 |
| 6,797,607 B1 * | 9/2004 | Endisch et al. | 438/623 |
| 6,808,742 B1 * | 10/2004 | Rouse et al. | 427/162 |
| 6,844,027 B1 * | 1/2005 | Gurer et al. | 427/240 |
| 2003/0108683 A1 * | 6/2003 | Wu | 427/580 |

FOREIGN PATENT DOCUMENTS

| | | |
|---|---|---|
| KR | 000003176 | 1/2000 |
| KR | 1020000003176 | 1/2000 |

OTHER PUBLICATIONS

Jpn. J. Appl. Phys. vol. 38 (1999), pp. L110-L112, "Preparation of Giant-Grain Seed Layer for Poly-Silicon Thin-Film Solar Cells", W. Yeh, et al.

* cited by examiner

← Crystal Growth Direction  ←---- Heat flow

← Crystal Growth Direction ←---- Heat flow

METHOD OF FORMING A BUFFER DIELECTRIC LAYER IN A SEMICONDUCTOR DEVICE AND A METHOD OF MANUFACTURING A THIN FILM TRANSISTOR USING THE SAME

BACKGROUND OF THE INVENTION

1. Field of the Invention

The present invention relates to a method of forming a buffer dielectric layer in a semiconductor device and a method of manufacturing a thin film transistor using the same, and, more particularly, to a method of forming a buffer dielectric layer in a semiconductor device and a method of manufacturing a thin film transistor using the same, in which grain size can be maximized, while suppressing the damage of a substrate, by minimizing heat transfer into the substrate, in a procedure of transforming an amorphous silicon layer into a polysilicon layer.

2. Description of the Prior Art

The polysilicon thin film transistor has been used as a device for driving a pixel of an active type liquid crystal display device or an active type organic EL and a device for driving a gate and a data driving circuit. In manufacturing of a SOD (System on a Display) having a driving circuit integrated on a panel, crystallization characteristics of the polysilicon is an important factor to determine a limit of the driving circuit block, capable of being integrated on the panel. For these reasons, the maximization of the grain size and the improvement of crystallization characteristics are required.

As a method for crystallizing the amorphous silicon using the laser, there are a Excimer Laser Annealing (ELA) method for obtaining polysilicon by scanning a pulse laser having a line beam shape and a Sequential Lateral Solidification (hereinafter, referred to as SLS) method for obtaining the polysilicon similar to the single crystaline silicon using the lateral crystal growth. Hereinafter, the method of forming a polysilicon layer using the ELA method and the SLS method will be explained with reference to FIGS. 1 and 2.

FIG. 1 is a perspective view illustrating a conventional method of forming the polysilicon active layer using the ELA method.

Referring to FIG. 1, an amorphous silicon layer 106a is formed on a buffer dielectric film 104 of $SiO_2$, which is formed on a glass or silicon wafer (Si-wafer) substrate 101. Then, the polysilicon active layer 106b having a grain size of about 200 to 400 nm is formed through ELA method. The scanning laser has a shape of line beam. Through the ELA method, a charge mobility of approximately 100 $cm^2/v.sec$ can be obtained.

However, the grain size of the polysilicon should be larger in order to improve the mobility sufficiently. But, the heat is quickly transferred into the $SiO_2$ of the buffer dielectric film 104 and the substrate 101 after the melting, before the crystal is sufficiently grown. Therefore, it is not easy to secure growth time enough and thus there is a limitation in enlarging the grain size.

FIG. 2 is a concept diagram illustrating a conventional method of forming the polysilicon active layer using the SLS method.

Referring to FIG. 2, unlike the ELA method, in the SLS method, a buffer dielectric film 104 of $SiO_2$ is formed on a substrate 101. An amorphous silicon layer 106a is formed on the $SiO_2$ film 104, and the laser beam is irradiated to the amorphous silicon layer 106a under a condition that a mask is patterned with constant intervals. Irradiation on the mask pattern 201 allows the portion shadowed by the mask pattern 201 to be grown in direction of the middle point. The amorphous silicon layer is transported with a pitch smaller than the interval of the mask pattern to be sequentially exposed to the laser, thereby the side of the side-grown crystal can be maximized. The SLS method was suggested by James S. Im et al., in U.S. Pat. No. 6,368,945B1, very improved charge mobility can be obtained, compared with the ELA method.

However, in the procedure of crystallizing the amorphous silicon layer by the SLS method, in case the size of the SLGs (Super Lateral Grain) is shorter than the half of the interval of the mask pattern, a new nucleation 202 is generated in the middle portion to which grain boundaries. For these reasons, the successive lateral-grown grain can not be obtained with ease. Accordingly, the interval of the mask pattern and the laser energy should be adjusted such that the nucleation 202 is not generated. But, a limitation in intervals of the mask pattern increases the number of the process mask to reduce the throughput thereof.

In addition, since the crystallization of the amorphous silicon layer uses laser energy as strong as melting the amorphous silicon to sufficiently grow the grain, in case of irradiation on the upper portion of the plastic substrate, the substrate may be damaged due to the heat. Accordingly, when the buffer dielectric film is formed with a single film of $SiO_2$, the laser beams can not be irradiated with sufficient energy. Thus, the laser energy should be reduced or the pulse time should be decreased in order to increase the grain size. But, this process has a limitation in increasing grain size.

On the other hand, Korean Laid-Open Patent Publication No. 2000-3176 describes the technique that a porous silica film is formed on a glass substrate, a silicon nitride film is formed thereon, and then a silicon layer is formed thereon. In the publication, the silicon nitride film is deposited with a chemical vapor deposition method using $SiH_4$ gas and $NH_3$ gas, and thus plenty of hydrogen is contained in the silicon nitride film after the deposition. This hydrogen generate a problem in that, when the amorphous silicon is crystallized by the laser annealing, it can generate the defects in the polysilicon film. In case the silicon nitride film exists over the porous silica film, since the heat conductivity of the silicon nitride film is somewhat higher than that of the silicon oxide film, the heat loss of the silicon nitride film may be larger than that of the silicon oxide film. For these reasons, the crystallization characteristics can be deteriorated. Further, in case the nitrogen components in the silicon nitride film are diffused into the channel of the polysilicon device, the device characteristics can be deteriorated.

SUMMARY OF THE INVENTION

Thus, in order to solve the above-mentioned problems, the object of the present invention is to provide a method of forming a buffer dielectric film in a semiconductor device and a method of manufacturing a thin film transistor using the same, in which a polysilicon active layer can be formed to improve the charge mobility of the device by having a maximized grain size, in case of crystallization of the amorphous silicon layer by the ELA method. The size of the SLG (Super Lateral Grain) can be increased to prevent the nucleation from being generated at the portion that the grain boundaries meet. The number of the process mask can be minimized and the throughput of the process can be improved, though the intervals of the mask pattern are increased, in case of crystallizing the amorphous silicon by the SLS method. It can be accomplished by forming a buffer dielectric film containing porous silica material having low heat conductivity between the amorphous silicon layer and the substrate, in order to minimize the heat transfer into the substrate.

According to one aspect of the present invention, a method of forming a buffer dielectric film in a semiconductor device comprises the steps of forming a silicon nitride film on a substrate; forming a porous silica film on the silicon nitride film; and forming a silicon oxide film on the porous silica film.

The substrate may be a glass substrate, a silicon wafer substrate, a plastic substrate, or a plastic substrate having an inorganic substrate attached to the lower surface thereof.

On the other hand, the step of forming the porous silica film includes the steps of mixing starting material containing silica with a solution and condensing the mixed material; applying the mixed material by a spin coating method after a predetermined condensing reaction is progressed; and performing thermal decomposition over a baking process. Here, tetraethoxy orthosilicate (TEOS) or tetramethoxy orthosilicate (TMOS) is used as the starting material, and ethanol is used as the solution. At this time, hydrochloric acid of acidic or ammonia water of basic may be mixed as catalyst or surfactant having both hydrophobic group and hydrophilic group may be mixed.

According to the other aspect of the present invention, a method of manufacturing a thin film transistor in a semiconductor device, comprising the steps of: forming a buffer dielectric film containing porous silica material on a substrate; forming an amorphous silicon layer on the buffer dielectric film; irradiating a laser to reform the amorphous silicon layer to a polysilicon active layer; forming a gate dielectric film on the entire surface of the substrate including the polysilicon active layer and then forming a gate electrode with a predetermined pattern; forming an interlayer dielectric layer on the entire surface of the substrate and then forming a contact hole such that the polysilicon active layer around the gate electrode is exposed; and forming a source electrode and a drain electrode on the polysilicon active layer.

Here, the polysilicon active layer may be formed by an ELA method or a SLS method.

DESCRIPTION OF THE PREPERRED EMBODIMENTS

Hereinafter, the embodiments of the present invention will be explained with reference to the accompanying drawings. However, the embodiment of the present invention can be changed into a various type, and it should be not understood that the scope of the present invention is limit to the following embodiments. The embodiments of the present invention are provided in order to explain the present invention to those skilled in the art. On the other hand, like numerals present like elements throughout the several figures.

Figure 1:
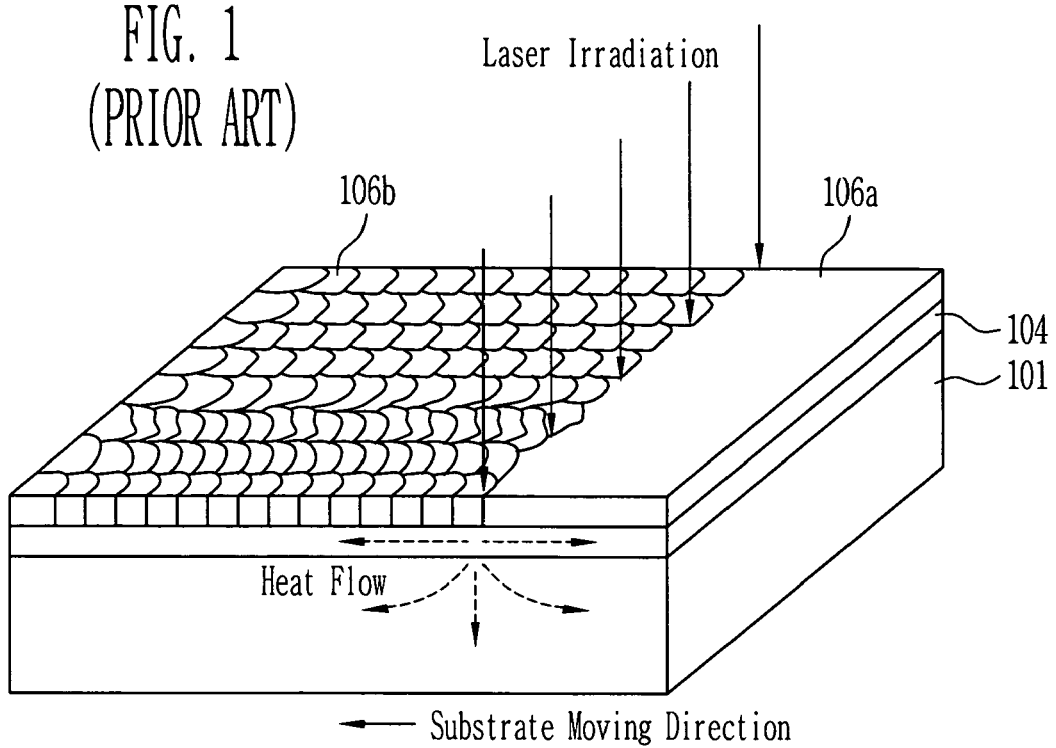
FIG. 1 is a perspective view illustrating a conventional method of forming a polysilicon active layer using an ELA method.
Figure 4:
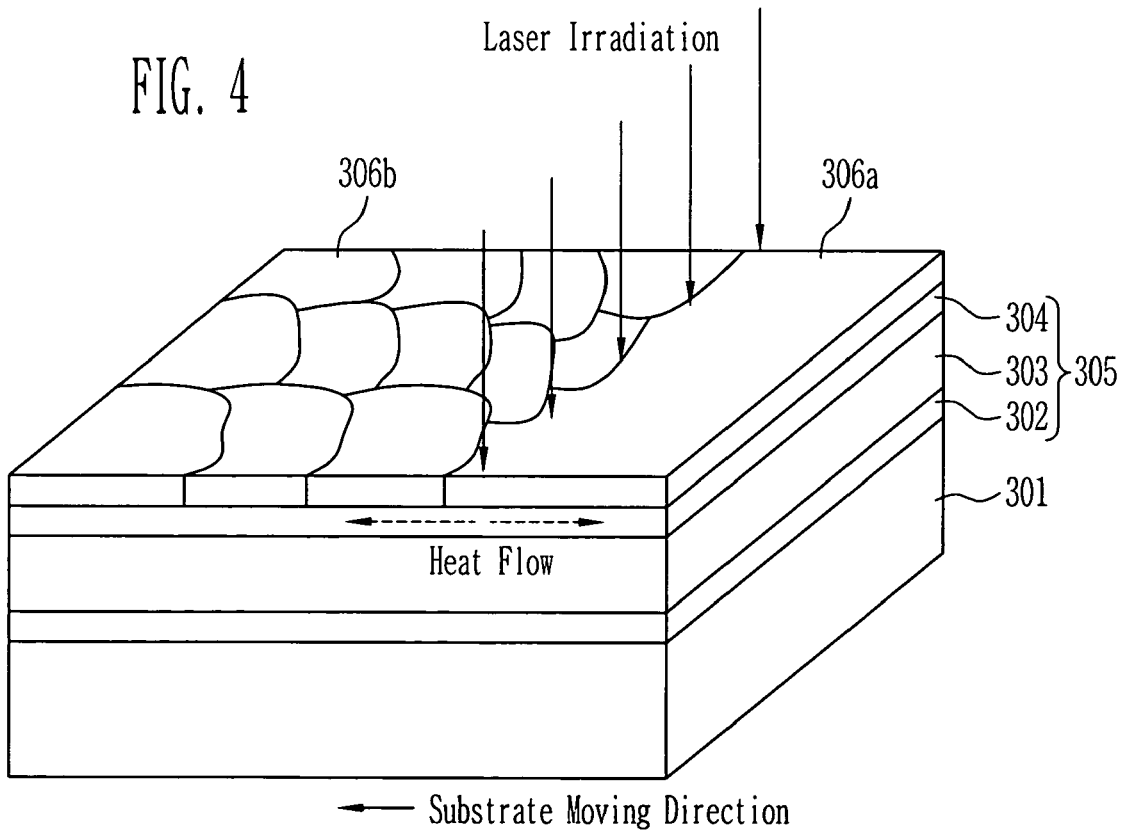
FIG. 4 is a perspective view illustrating a case of forming the polysilicon active layer by the ELA method in FIG. 3D.
Figure 2:
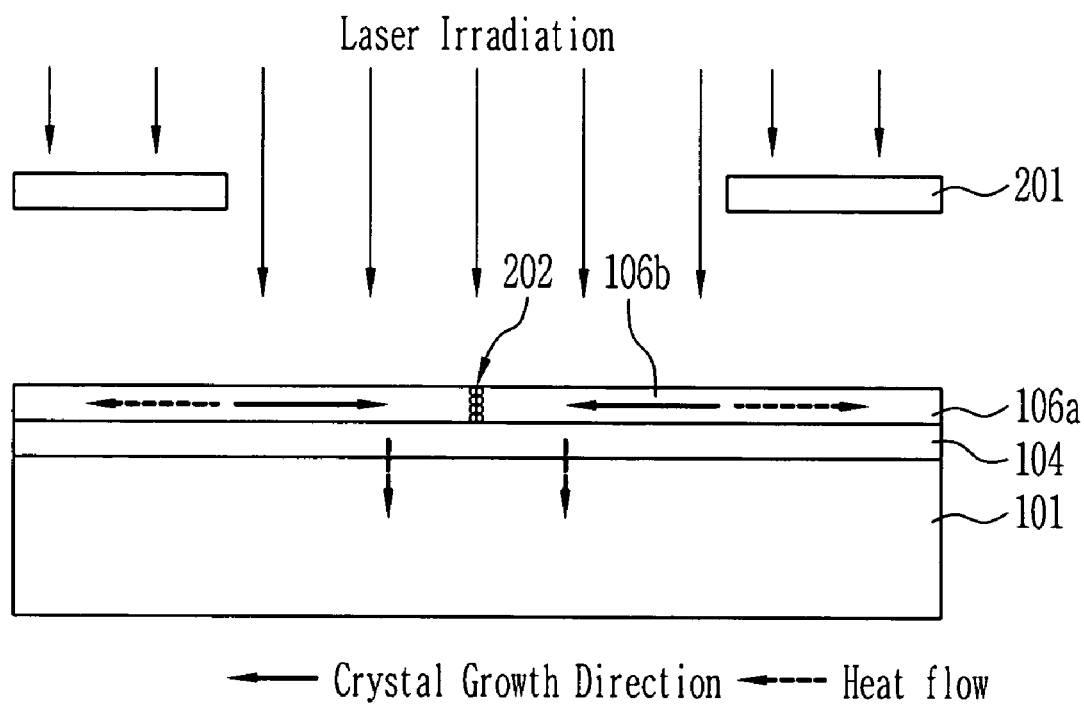
FIG. 2 is a concept diagram illustrating a conventional method of forming the polysilicon active layer using a SLS method.
Figure 2:
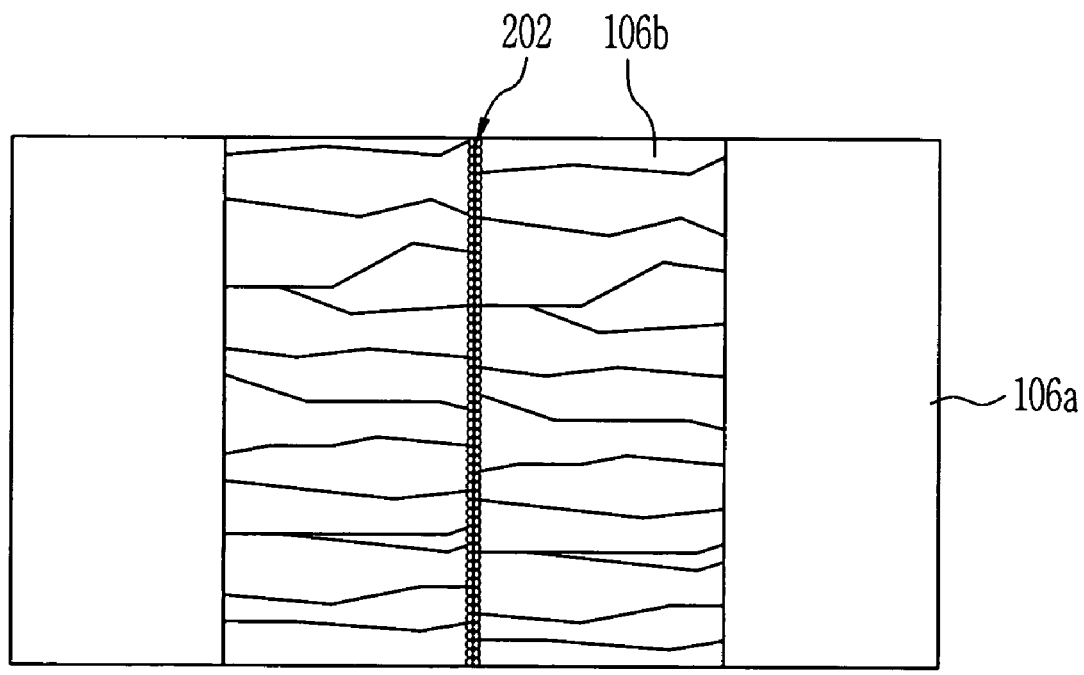
Figure 5:
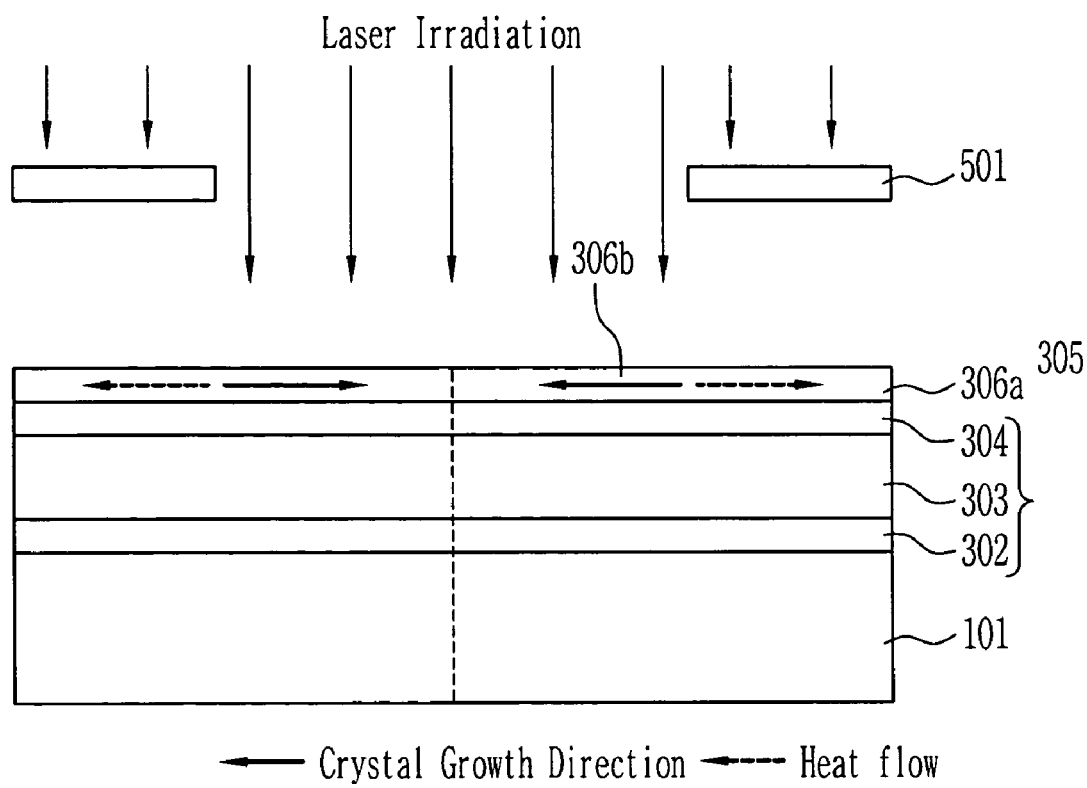
FIG. 5 is a concept diagram illustrating a case of forming the polysilicon active layer by the SLS method in FIG. 3D.
Figure 5:
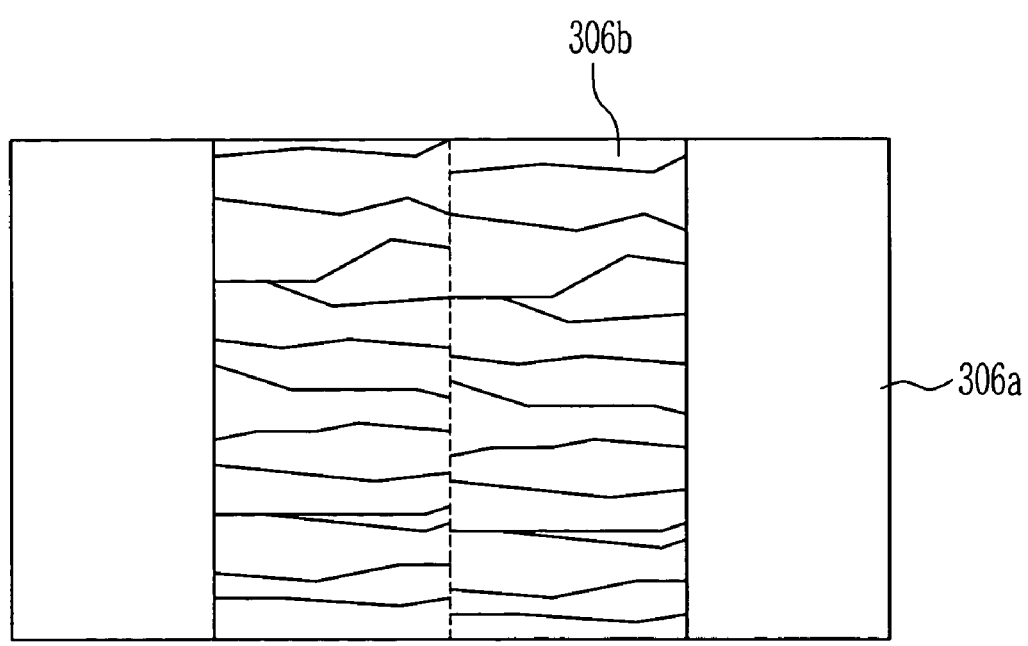

FIGS. 3A to 3F are cross sectional views illustrating a method of manufacturing a thin film transistor in a semiconductor device according to the embodiment of the present invention. FIG. 4 is a perspective view illustrating a process of forming the polysilicon active layer with the ELA method in FIG. 3D. FIG. 5 is a concept diagram illustrating a process of forming the polysilicon active layer with the SLS method in FIG. 3D.

Figure 3A:
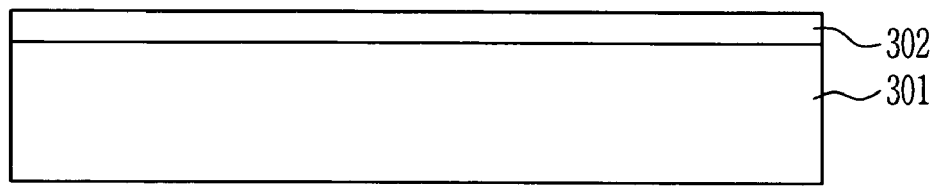
FIGS. 3A to 3F are cross sectional views illustrating a method of manufacturing a thin film transistor in a semiconductor device according to the embodiment of the present invention.

Referring to FIG. 3A, a buffer protective layer of a silicon nitride film 302 is formed on a substrate 301. As a substrate 301, a glass, a silicon wafer or a plastic substrate may be used. An inorganic substrate such as a glass or silicon wafer may be attached to the lower surface of the plastic substrate, in order to prevent the mechanical defects such as cracks or structural destruction from being generated in the film on the substrate due to bending force according to the plastic characteristics. The inorganic substrate (not shown) attached to the lower surface of the plastic substrate may be removed after manufacturing the thin film transistor.

On the other hand, the silicon nitride film 302 is deposited with a thickness of about 1000 to 3000 Å, by a PECVD method using $SiH_4$, $NH_3$ and $N_2$ gas. The silicon nitride film 302 prevents the impurities contained in the substrate 301 from penetrate into the channel portion of the device, and protects the substrate from the moistures in case of the plastic substrate through which the moisture can pass. In addition, it reduces the generation of the defects and improves the electric characteristics of the device by diffusing contained hydrogen, when depositing the silicon nitride film, so as to couple it with the dangling bond of the silicon channel portion during the hydrogenation process.

Figure 3B:
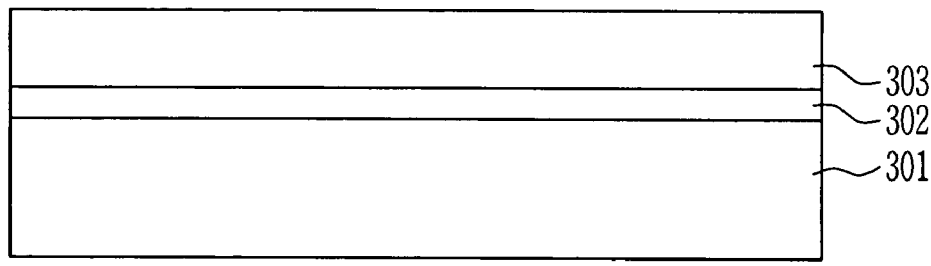

Referring to FIG. 3B, porous silica material of low heat conductivity is made through a sol-gel method and it is coated on the silicon nitride film through a spin coating method. Accordingly, a porous silica film 303 is formed on the silicon nitride film 302.

Hereinafter, the method of forming the porous silica film 303 will be explained in detail. First, starting material containing the silica such as TEOS (tetraethoxy orthosilicate) or TMOS (tetramethoxy orthosilicate) and solvent such as ethanol are mixed and condensed. At this time, to promote the condensation reaction, a hydrochloric acid (HCl) solution of acidity or an ammonia water of basic is used as catalyst and surfactant having both hydrophilic property group and hydrophobic property group may be utilized. When the condensation reaction of the solution is processed to have a suitable viscosity, the spin coating process is performed to form the film and the surfactant is removed by performing thermal decomposition using the baking, thereby the porous silica film can be formed.

The heat conductivity of the porous silica film 303 is smaller than that of the dense solid film, due to a fine porous pore. In crystallization of the amorphous silicon layer, the amorphous silicon layer is melted by laser beams and the nucleation is generated. Thus, when grain is grown, the amount of the heat transferred to the substrate can be minimized and the growth time can be maximized. In addition, since the porous silica film 303 has a function of preventing the heat transfer between the silicon portion and the substrate, the heat impact on the substrate during the crystallization process can be minimized to allow the plastic substrate. Therefore, the plastic substrate is useful in this case.

Figure 3C:
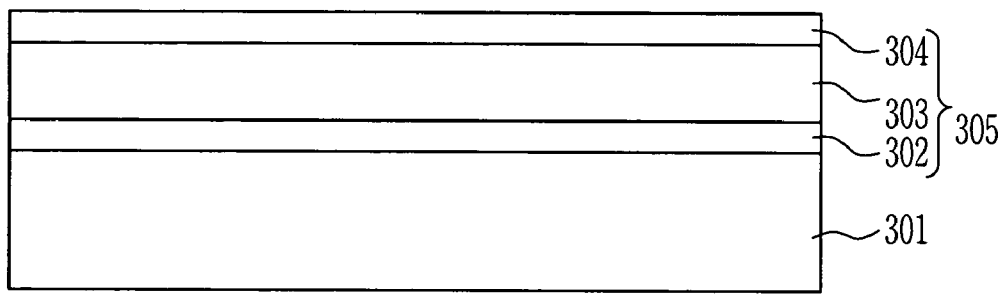

Referring to FIG. 3C, after a surface modification of the porous silica film 303 is performed through a plasma process, a silicon oxide film 304 is formed on the porous silica film 303. The buffer dielectric film 305 containing porous silica material is composed of a laminated structure of the silicon nitride film 302, the porous silica film 303 and the silicon oxide film 304.

Here, the silicon oxide film 304 is deposited with a thickness of no more than 3000 Å by the PECVD method using $SiH_4$, $N_2O$, and Ar gas. At this time, the silicon oxide film 304 improves the interface characteristics with the silicon thin film (will be formed in the subsequent process) and acts as a buffer of equalizing the heat flow, with an excellent adhesive force. In addition, the silicon oxide film 304 functions as the surface roughness. To minimize the surface roughness, the silicon oxide film 304 can be formed with a double layer, which comprises a first layer of silicon oxide film for surface planarization with a method such as a SOG (Spin On Glass) method and a second layer of the silicon oxide film 304 through the PECVD method. The silicon oxide film 304 may be formed with a single film formed by the SOG method.

Figure 3D:
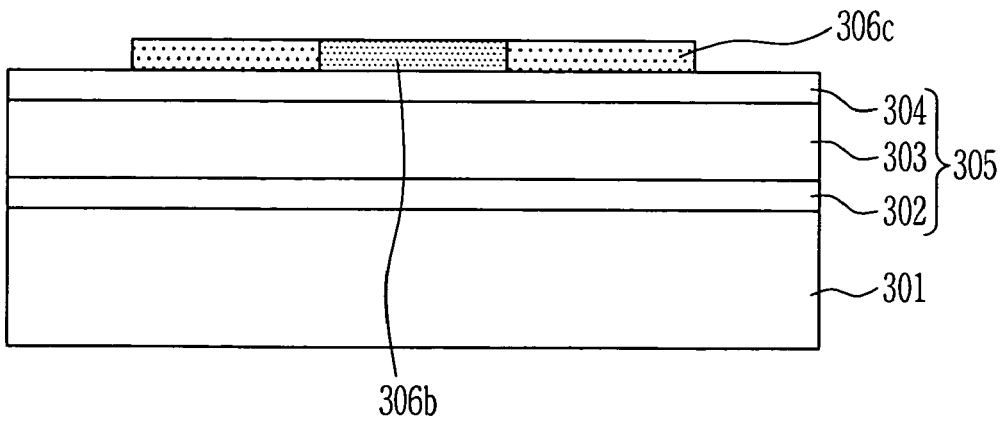

Referring to FIG. 3D, an amorphous silicon layer (not shown) is formed on a predetermined region of the buffer dielectric film 305 and then the crystallization process is performed using the laser to transform the amorphous silicon layer into a polysilicon active layer 306b. The impurities are injected into a predetermined portion (for example, source/drain region) of the polysilicon active layer 306b to form a doped polysilicon active layer 306. In this case, the crystallization process can be performed through the ELA method or the SLS method. Hereinafter, the ELA method and the SLS method will be described with reference to drawings.

FIG. 4 is a perspective view illustrating a process of crystallizing the amorphous silicon layer by the ELA method. Referring to FIG. 4, while a stage moving on which the substrate 301 is mounted, the laser beams are irradiated to the amorphous silicon layer 306. In this case, if the ELA crystallization is performed under the condition that only the silicon oxide film is formed as a buffer dielectric film, the heat flow from the melting portion of the silicon to the substrate is increased. For these reasons, the heat can not be maintained for a long time owing to the shortage of growth time. It makes the polysilicon thin film to have a small grain size. However, in the present invention, by forming a buffer dielectric film 305 containing the porous silica material as the buffer dielectric film, the heat transfer from the melting portion into the substrate 301 can be efficiently blocked. The heat can be preserved during the growth period and the polysilicon active layer 306b having a large grain size can be acquired.

FIG. 5 is a cross sectional view illustrating the process of crystallizing the amorphous silicon layer through the SLS method.

Referring to FIG. 5, conventionally, since the buffer dielectric film is formed with the single film, there is a problem that the heat is transferred to the substrate direction during the crystallization process. Therefore, super lateral grain size is not increased as is needed. In addition, the generation of the nucleation can be prevented in the middle portion of the crystal by reducing the interval of the mask pattern, but, by this method, there is a problem that it takes long time to sequentially form the polysilicon layer over the entire surface of the substrate. It may deteriorate a throughput. However, in the present invention, the heat flow transferred to the substrate 301 is minimized in the buffer dielectric film 305 containing the porous silica film 303. The size of the SLG in the laterally grown silicon can be increased by irradiating the laser beam only one time. It is needless to reduce the interval of the mask pattern 501 and the throughput can be improved.

In addition, in case of the plastic substrate, since the porous silica film 303 of small heat conductivity efficiently prevents the heat flow from being transferred to the plastic substrate. The laser beam can be irradiated with sufficient energy, thereby the polysilicon active layer 306b has a large grain size.

Figure 3E:
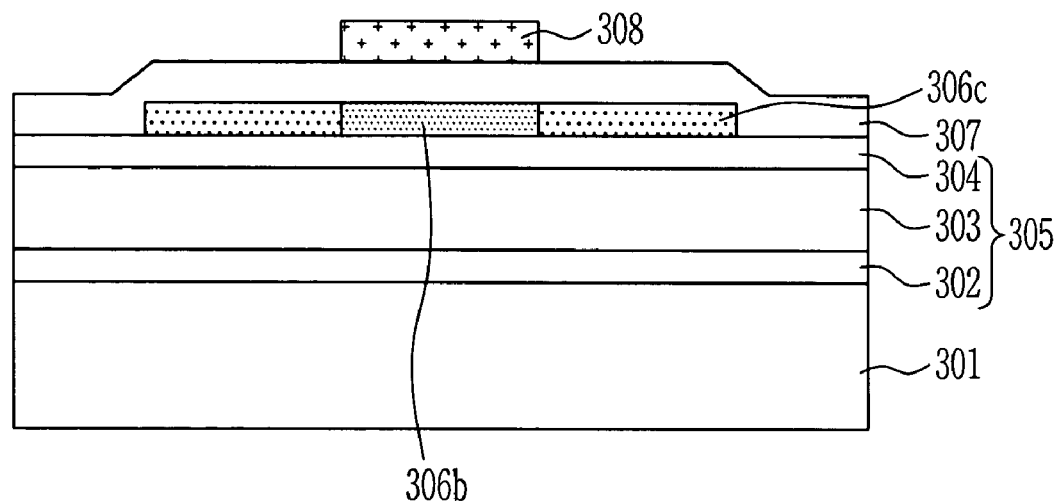

Referring to FIG. 3E, a gate dielectric film 307 is deposited over the entire surface of the substrate including the polysilicon active layer 306b and the doped polysilicon active layer 306c. Subsequently, a gate electrode 308 is deposited on the gate dielectric film 307 over the polysilicon active layer 306b, and then P-type impurities are injected into a P-type thin film transistor and N-type impurities are injected into a N-type thin film transistor. After the doping of the impurities, the heat treatment is performed in order to activate the impurities. The heat treatment may be within a furnace. The heat treatment may be a rapid heating process, a microwave heating process or a laser activating process.

Figure 3F:
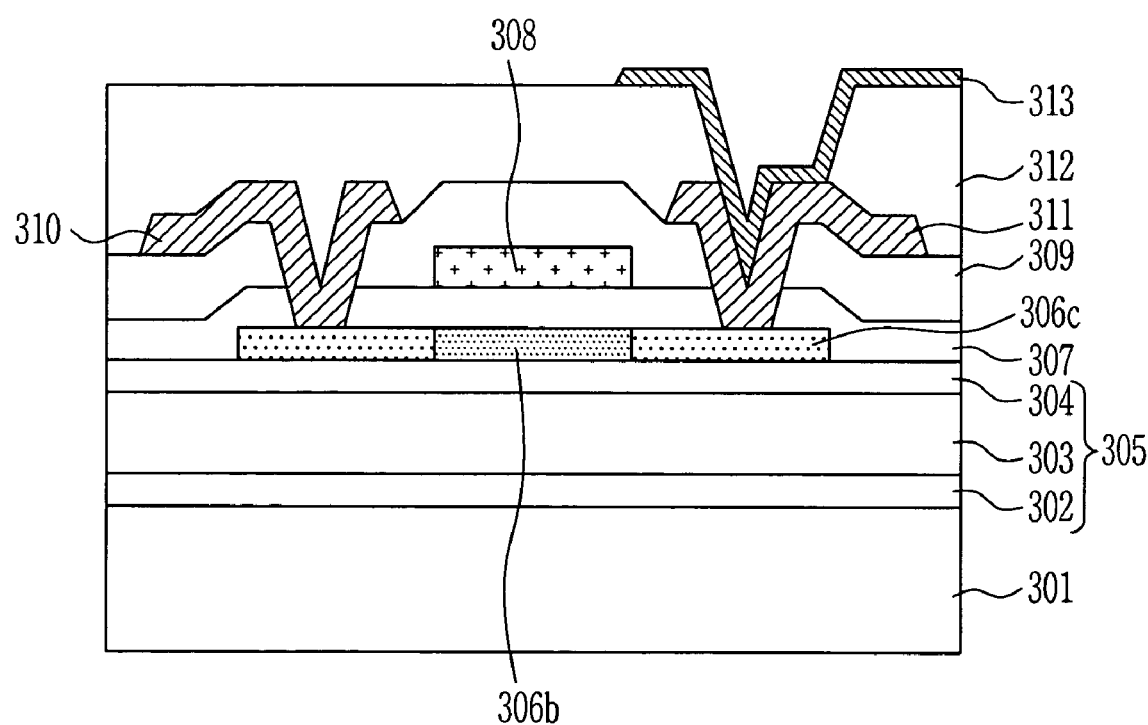

Referring to FIG. 3F, an interlayer dielectric film 309 is formed on the entire surface of the substrate, a contact hole is formed in the interlayer dielectric film 309 such that the doped polysilicon active layer 306c is exposed partly, and then a source electrode 310 and a drain electrode 311 are deposited and patterned as a data electrode. Subsequently, a protective layer 312 is formed on the thin film transistor, the hydrogenation process may be performed, and then a contact hole is patterned in the protective layer 312 such that the drain electrode 311 is exposed partly. A pixel electrode 313 is formed on the drain electrode 311, thus completing the thin film transistor.

As mentioned above, in the present invention, since buffer dielectric film containing the porous silica material is introduced, the heat conductivity of the buffer layer can be remarkably decreased and the size of the SLG can be maximized in the crystallization process using the sequential lateral solidification. It can improve the throughput due to reduction in number of moving mask. Further, since the heat transferred to the substrate can be blocked during crystallizing process by the ELA method to increase the growth time, the grain size is increased and the charge mobility can be improved.

In addition, in case of manufacturing the polysilicon thin film transistor on the plastic substrate sensitive to the temperature, the buffer dielectric layer according to the present invention prevents the substrate from being damaged due to the irradiation. Therefore, the laser beam of sufficient energy can be irradiated to form the polysilicon layer.

Although the present invention has been illustrated and described with respect to exemplary embodiments thereof, the present invention should not be understood as limited to the specific embodiment, and it should be understood by those skilled in the art that the foregoing and various other changes, omission and additions may be made therein and thereto, without departing from the spirit and scope of the present invention.

What is claimed is:

1. A method of manufacturing a thin film transistor in a semiconductor device, comprising the steps of:
    forming a buffer dielectric film containing porous silica material on a substrate;
    forming an amorphous silicon layer on said buffer dielectric film;
    irradiating a laser beam to transform said amorphous silicon layer into a polysilicon active layer;
    forming a gate dielectric film on the entire surface of the substrate including said polysilicon active layer and then forming a gate electrode with a predetermined pattern;
    forming an interlayer dielectric layer on the entire surface of the substrate and then forming a contact hole such that said polysilicon active layer around said gate electrode is exposed; and
    forming a source electrode and a drain electrode on said polysilicon active layer.

2. The method according to claim 1, wherein said polysilicon active layer is formed by an ELA method or a SLS method.

3. The method according to claim 1, wherein the method of forming a buffer dielectric film in a semiconductor device, comprising the steps of:
    forming a silicon nitride film on a substrate;
    forming a porous silica film on said silicon nitride film; and
    forming a silicon oxide film on said porous silica film.

4. The method according to claim 3, wherein said substrate is a glass substrate, a silicon wafer substrate, a plastic substrate, or a plastic substrate having an inorganic substrate attached to the lower surface thereof.

5. The method according to claim 3, wherein said step of forming said porous silica film includes the steps of;
    mixing starting material containing silica with a solution and condensing the mixed material;
    applying the condensed material on said silicon nitride using spin coating method after a predetermined condensing reaction is progressed; and
    performing thermal decomposition through a baking process.

6. The method according to claim 5, wherein tetraethoxy orthosilicate (TEOS) or tetramethoxy orthosilicate (TMOS) is used as said starting material, and ethanol is used as said solution.

7. The method according to claim 5, wherein hydrochloric acid of acidic or ammonia water of basic is mixed as catalyst or surfactant having both hydrophobic group and hydrophilic group is mixed.

* * * * *